US007742307B2

(12) United States Patent
Ellsworth et al.

(10) Patent No.: US 7,742,307 B2
(45) Date of Patent: Jun. 22, 2010

(54) HIGH PERFORMANCE POWER DEVICE

(75) Inventors: Joseph R. Ellsworth, Worcester, MA (US); Michael P. Martinez, Worcester, MA (US); Stephen J. Pereira, Hopedale, MA (US)

(73) Assignee: Raytheon Company, Waltham, MA (US)

( * ) Notice: Subject to any disclaimer, the term of this patent is extended or adjusted under 35 U.S.C. 154(b) by 56 days.

(21) Appl. No.: 12/015,918

(22) Filed: Jan. 17, 2008

(65) Prior Publication Data

US 2009/0185352 A1 Jul. 23, 2009

(51) Int. Cl.
*H05K 7/20* (2006.01)
*B32B 3/26* (2006.01)

(52) U.S. Cl. ............... 361/720; 361/699; 361/704; 361/707; 361/719; 428/320.2; 428/322.7

(58) Field of Classification Search .................. None
See application file for complete search history.

(56) References Cited

U.S. PATENT DOCUMENTS

| | | | | | |
|---|---|---|---|---|---|
| 4,711,804 | A | * | 12/1987 | Burgess | 428/210 |
| 5,306,571 | A | * | 4/1994 | Dolowy et al. | 428/608 |
| 5,958,572 | A | * | 9/1999 | Schmidt et al. | 428/320.2 |
| 6,075,701 | A | | 6/2000 | Ali et al. | |
| 6,212,071 | B1 | | 4/2001 | Roessler et al. | |
| 6,222,740 | B1 | * | 4/2001 | Bovensiepen et al. | 361/795 |
| 6,317,331 | B1 | * | 11/2001 | Kamath et al. | 361/760 |
| 6,400,570 | B2 | * | 6/2002 | Schreffler | 361/704 |
| 6,490,159 | B1 | | 12/2002 | Goenka et al. | |
| 6,514,616 | B1 | | 2/2003 | Gandi et al. | |
| 6,587,346 | B1 | | 7/2003 | Parker | |
| 6,661,317 | B2 | * | 12/2003 | Ali et al. | 333/247 |
| 6,689,471 | B2 | * | 2/2004 | Gandi et al. | 428/408 |
| 6,903,931 | B2 | | 6/2005 | McCordic et al. | |
| 6,984,685 | B2 | | 1/2006 | Misra et al. | |
| 7,026,664 | B2 | | 4/2006 | Divakar et al. | |
| 7,119,284 | B2 | | 10/2006 | Bel et al. | |
| 2007/0151708 | A1 | | 7/2007 | Touzov | |
| 2007/0215381 | A1 | * | 9/2007 | Vasoya | 174/262 |

OTHER PUBLICATIONS

Zweben, Carl, "Thermal Materials Solve Power Electronics Challenges", Power Electronics Technology, Feb. 2006, 8 pages.
GlobalSpec, The Engineering Search Engine, "Pyroid® HT Pyrolytic Graphite Thermal Spreaders", Dec. 12, 2007, http://www.globalspec.com, 2 pages.
Newland et al., "Applications for High Thermal Conductivity Graphite Heat Sinks for Fighter Avionics", SAE International, Doc No. 2004-01-2570, Jul. 2004, http://www.dodsbir.net/sitis/view_pdf.asp?id=04ICES-263.pdf., 4 pages.

* cited by examiner

*Primary Examiner*—Gregory D Thompson
(74) *Attorney, Agent, or Firm*—Daly, Crowley, Mofford & Durkee, LLP

(57) ABSTRACT

A printed circuit board (PCB) assembly is provided. The PCB assembly is adapted for mounting at least one heat-generating electrical device and providing integrated heat dissipating capability to dissipate heat generated by the electrical device. The PCB assembly has a top surface and a bottom surface and comprises a signal carrying layer and an insert of pyrolytic graphite (PG). The signal carrying layer, disposed between the top surface and the bottom surface, comprises a material that is both thermally conductive and electrically conductive (such as at least one of aluminum, copper, and silver and alloys thereof) and has at least a portion lying in a first plane. The insert of PG is disposed within at least a portion of the first plane of the signal carrying layer, is in thermal contact with the signal carrying layer, and is constructed and arranged to have its greatest electrical conductivity in the first plane. Optionally, a conductive via can be formed in portions of the signal carrying layer not occupied by the insert of PG, where the conductive via operably couples a first side of the signal carrying layer to a second side of the signal carrying layer.

30 Claims, 13 Drawing Sheets

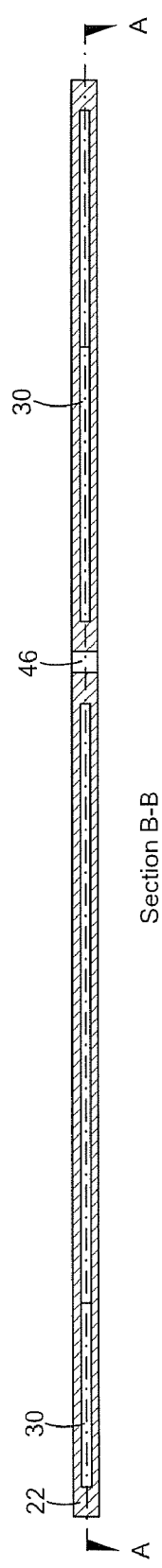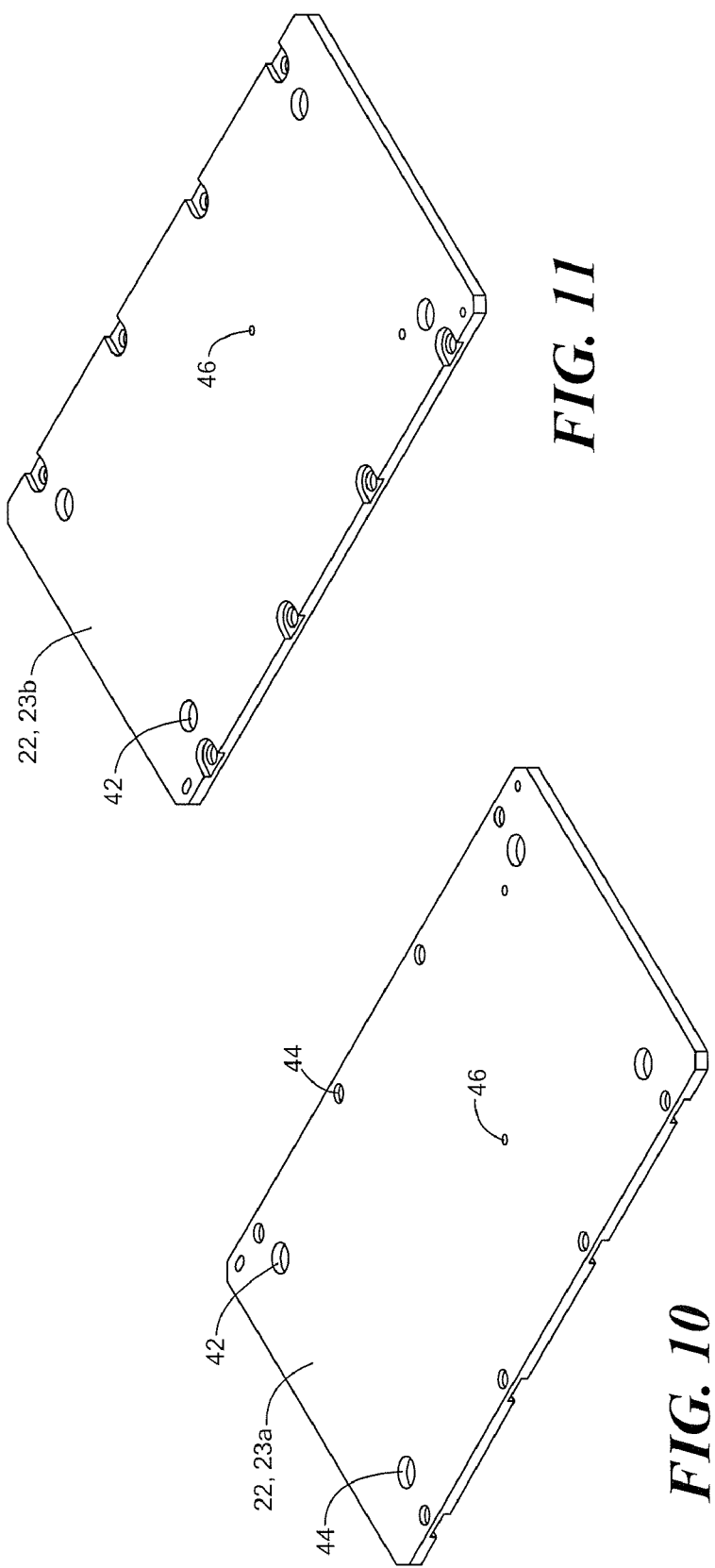

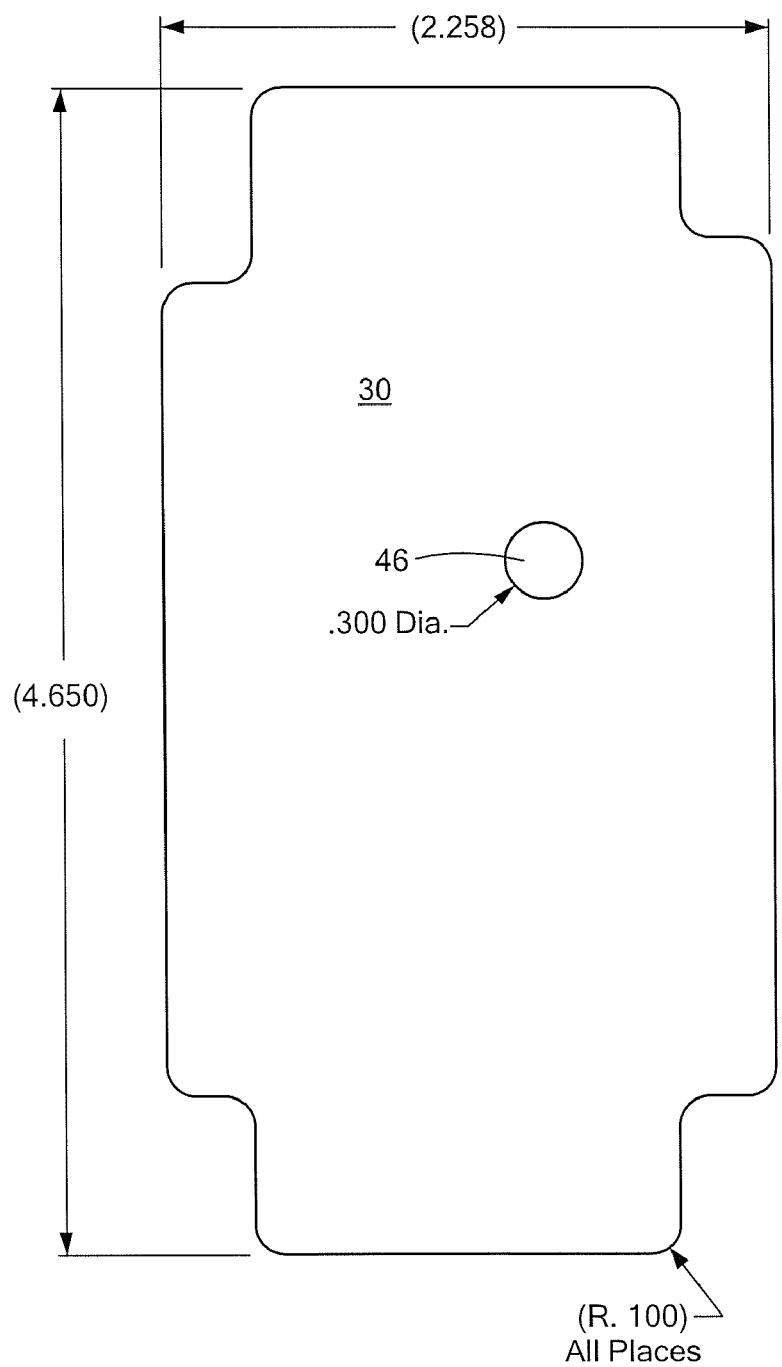
*FIG. 14*  *FIG. 15*

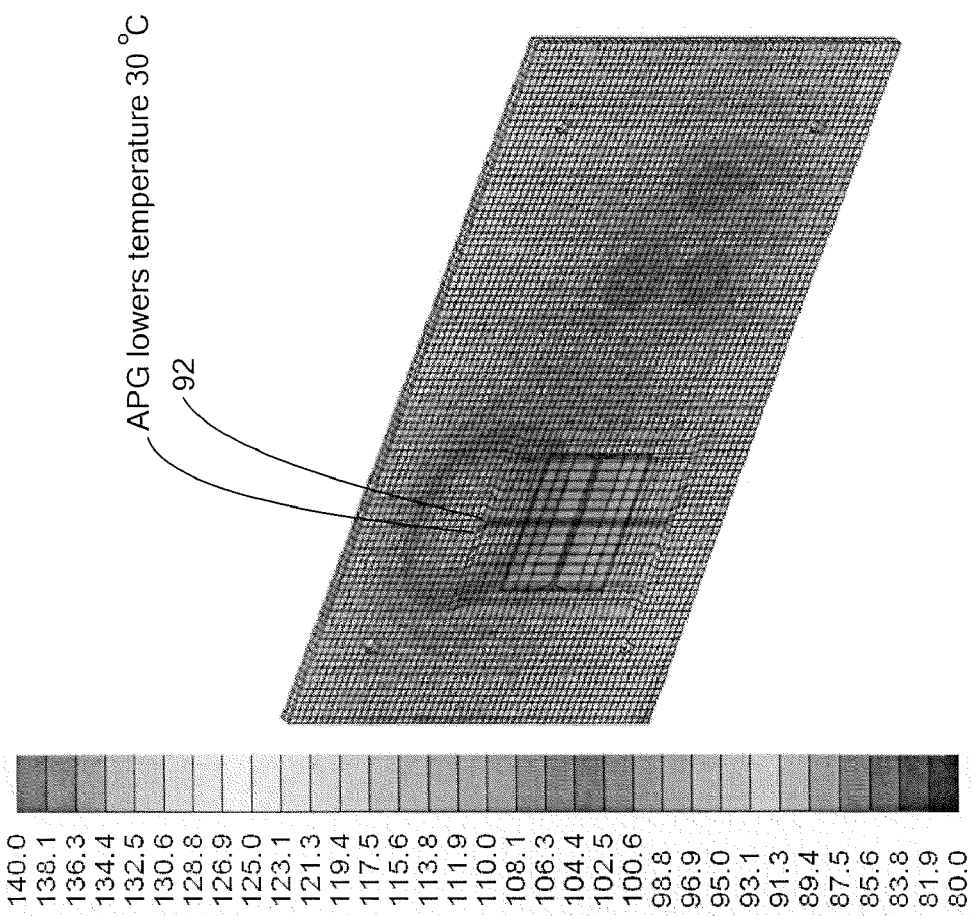
*FIG. 19*
*FIG. 18*
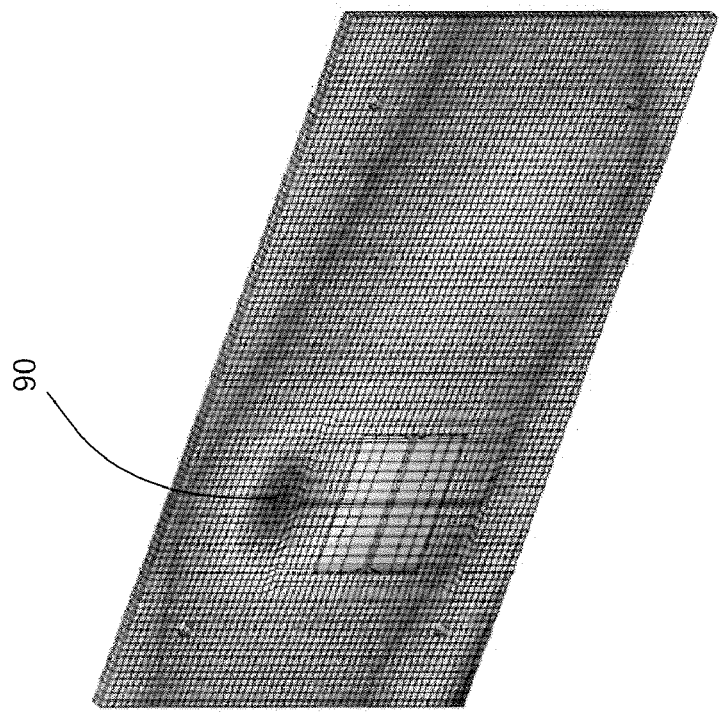
*FIG. 17*

HIGH PERFORMANCE POWER DEVICE

CROSS-REFERENCE TO RELATED APPLICATIONS

This application is related to U.S. Pat. No. 6,903,931 to McCordic et al., entitled "Cold Plate Assembly," the contents of which are hereby incorporated by reference.

FIELD OF THE INVENTION

Embodiments of the invention generally relate to power devices such as DC-DC converters. More particularly, the invention relates to a power device assembly that integrates both signal carrying and thermal cooling functions into a single circuit card.

BACKGROUND OF THE INVENTION

Electrical components, especially those used as part of power devices, can often generate significant heat during operation. Because high temperatures can degrade the performance of (or even cause the failure of) many electrical components, assemblies that use such heat-generating components must be able to dissipate heat well enough to maintain acceptable performance of the electrical component.

Many different techniques can be used to provide cooling of electrical components. For example, circulation of air within a housing can be sufficient to cool some types of electrical components contained within the housing. Some electrical assemblies further include physical features (e.g., cooling fins) that increase the surface area exposed to convective air currents, or provide fans to circulate the air further, providing further cooling. This air cooling can be insufficient, however, for high power circuits and/or densely packed circuits.

High power and/or densely packed circuits can need additional heat dissipation, such as by mounting some or all of the electrical components to a thermal dissipation member such as a "cold plate," thermal pad, heat spreader, dissipater, evaporator, or other type of heat sink. The thermal dissipation member can, for example, be made using one or more materials having high thermal conductivity (e.g., metals such as copper and aluminum). The thermal dissipation member is able to conduct heat away from the electrical device and into the environment via contact between the thermal dissipation member and a structure designed to transfer the heat to the surrounding air or a liquid via conduction and convection. In some instances, a series of thermal dissipation members work together to provide cooling.

DC/DC converter power supplies are an example of an electrical assembly capable of generating significant heat. In one example, DC/DC converter power supplies used with a phased-array radar system currently are made using an assembly in which dielectric material is attached to a metal baseplate. The power components (e.g., power amplifiers, power transistors, rectifiers, transformers, etc.) also are coupled to the baseplate. The metal base of the baseplate efficiently transfers the heat from the high dissipating components to the edges of the baseplate, where the edges of the baseplate are coupled to a heat sink in a higher level assembly that help to provide further cooling. These illustrative DC/DC converter power supplies use aluminum as the baseplate material. An aluminum baseplate is considerably better at transferring heat to the edges of a baseplate than dielectric material alone, but aluminum still has some thermal limitations. Because of aluminum's thermal limitations, in some instances it is necessary to break up a single higher power DC/DC converter into multiple lower power designs, resulting in higher cost and weight.

One known technique for reducing the temperature of the electric devices is by coupling the electric devices to heat sinks with graphite and/or aluminum added to the heat sink which increases the thermal conductivity of the entire heat sink, such as described in U.S. Pat. No. 6,075,701, which is incorporated herein in its entirety. The '701 patent describes embedding a layer of pyrolytic graphite within an aluminum casing having top and bottom sides such that the pyrolytic graphite intimately contacts an interior wall of the aluminum casing. Electrical components can be affixed directly to a top side of the casing, and a heat sink is affixed to the bottom side of the casing, such that heat generated by the electrical component can flow vertically downward from the electrical component, through the casing and embedded pyrolytic graphite, and into the heat sink. However, heat sinks or cold plates with added graphite and/or aluminum to increase the thermal conductivity of the heat sink or cold plate increase the size, weight, and cost of the device.

In some types of electronic devices, such as DC-DC converters, certain components are known to contribute significantly more heat than other components. For example, in some DC/DC converters, the design is driven by two high heat-dissipating components: the main transformer and the output rectifier. Using a standard aluminum baseplate, the temperature rise from the cooled edge to the component's mounting location is a significant portion of the total allowable temperature rise. In one illustrative device, the temperature rise in the aluminum baseplate alone uses almost 50% of the total allowable temperature rise for the device. In higher power DC/DC converters, that temperature rise alone can exceed the total allowable temperature rise, and a more expensive alternate design must be implemented, a significant portion of the allowable temperature rise from the component locations to the cooled edges comes transformer and output rectifier.

SUMMARY OF THE INVENTION

Because of issues such as the device temperature rise, it would be advantageous to reduce the temperature rise as much as possible in as many areas as possible, such as the coldplate and/or baseplate of a DC/DC converter. Reducing coldplate and/or baseplate temperature rise permits the design of DC/DC converters having high power, which can help to reduce cost (e.g., replacing multiple lower power converters with a single higher power converter), meet future mission requirements that draw more power, and improve reliability, because the components will not be as thermally stressed. As described further in at least some embodiments of the invention described herein, fabricating the DC/DC converter power circuit card from a panel that has pyrolytic graphite (PG) inserts helps to provide at least some of these advantages, as well as many other advantages described herein. PG is particularly advantageous because it has an in-plane thermal conductivity that is ten times greater than that of aluminum. This property also can help to reduce the component to edge temperature rise in devices that use PG.

In one aspect, the invention provides a power card usable for a DC/DC converter, where the power card has a baseplate made of a material that is both electrically and thermally conductive and which has one or more inserts of annealed pyrolytic graphite (PG) embedded therein. Doing this helps to transfer heat generated by electrical components coupled to the power card, such as the high-heat flux electrical components and/or the other electrical components, away from the components much more effectively than is done using merely a conductive layer or a baseplate that does not have PG inserts. Because the power card baseplate also is electrically conductive, the power card baseplate not only improves thermal performance, the power card baseplate can perform two functions at once and save weight and cost in the power card, thereby improving performance in and saving weight and cost of the resultant DC/DC converter 10, as well. If the power card has embedded PG inserts, as described herein, a separate heat sink coupled to the power card is not needed to maintain desired thermal performance. Optionally, however, the power card can be coupled to a cold plate or other heat sink, in a next higher assembly, to further distribute and dissipate the heat.

The following presents a simplified summary to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one aspect, the invention provides a circuit card assembly, comprising a first layer, a first insert of pyrolytic graphite (PG), and a second layer. The first layer has first and second sides and comprises a first material that is electrically and thermally conductive, and the first layer is constructed and arranged to be capable of carrying electrical signals. The first insert of PG is disposed between the first side and the second side of the first layer, and the first insert is constructed and arranged within the first layer so as to be surrounded on all sides by the first layer, such that at least a portion of the first insert is in thermal contact with at least a portion of the first layer. The first insert is oriented within the first layer such that the insert can dissipate heat generated by the circuit card assembly. The second layer has first and second sides and comprises at least one of an insulating and a dielectric material, wherein the second side of the second layer is coupled to the first side of the first layer so as to overlay at least a portion of the first layer.

In a further embodiment, at least a portion of the first layer lies in a plane and the first insert is substantially planar in the x-y direction, is constructed and arranged to have its highest thermal conductivity in the x-y plane, and is oriented within the first layer so that the plane of the first insert is substantially parallel to the plane of the portion of the first layer.

At least a portion of the second layer can be electrically coupled to the first layer. At least one of the first and second layers can be constructed and arranged to permit a heat-generating electrical component to be operably coupled thereto, wherein the circuit card assembly can be constructed and arranged to dissipate the heat generated by the electrical component. The first layer can comprise at least one of aluminum, copper, and silver and alloys thereof. The circuit card assembly can comprise at least a portion of a power card, a DC/DC converter, a power supply, a DC/AC converter, an AC/DC converter, and an AC/AC converter. A conductive via can be formed in the first layer, the conductive via operably coupling the first side of the first layer to the second side of the first layer, wherein the conductive via is formed in a portion of the first layer that is not occupied by the first insert.

The circuit card assembly can also comprise a second insert of PG disposed between the first side and the second side of the first layer, the second insert being constructed and arranged within the first layer so as to be surrounded on all sides by the first layer, such that at least a portion of the second insert is in thermal contact with at least a portion of the first layer, wherein the second insert is oriented within the first layer such that the second insert can dissipate heat generated by the circuit card assembly.

In a further embodiment, the circuit card assembly has at least one thermally conductive edge, wherein the first layer is in thermal contact with the thermally conductive edge, and wherein the first insert is oriented within the first layer so as to dissipate heat towards the thermally conductive edge of the circuit card assembly.

In still another embodiment, the circuit card assembly further comprises a thermal dissipation member in thermal contact with the thermally conductive edge, wherein the circuit card assembly is constructed and arranged to dissipate the heat generated by the electrical component from the edge of the circuit card assembly into the thermal dissipation member. The thermal dissipation member can, for example, comprise at least one of a cold plate, thermal pad, heat spreader, dissipater, evaporator, and heat sink.

In yet another embodiment, the first layer and the first insert each has a respective thickness, wherein the first insert has a thickness greater than or equal to half the thickness of the first layer. The first insert can be disposed within the first layer such that the thickness of first layer between the first insert and the first side of the first layer is less than the thickness of the first insert.

In another aspect of the invention, the first layer comprises a first portion and a second portion fixedly coupled together around the first insert of pyrolytic graphite, the first portion having an opening formed therein that is sized to receive the first insert and a second portion constructed and arranged to mate to the first portion so as to hold the first insert of pyrolytic graphite in a substantially fixed position.

In still another aspect of the invention, a printed circuit board (PCB) assembly adapted for mounting at least one heat-generating electrical device and providing integrated heat dissipating capability to dissipate heat generated by the electrical device, is provided. The PCB has a top surface and a bottom surface and comprises a signal carrying layer and an insert of pyrolytic graphite (PG). The signal carrying layer, disposed between the top surface and the bottom surface, comprises a material that is both thermally conductive and electrically conductive (such as at least one of aluminum, copper, and silver and alloys thereof) and has at least a portion lying in a first plane. The insert of PG is disposed within at least a portion of the first plane of the signal carrying layer, is in thermal contact with the signal carrying layer, and is constructed and arranged to have its greatest electrical conductivity in the first plane.

In one embodiment, the PCB further comprises at least one edge, and the signal carrying layer is in thermal contact with the edge, wherein the edge is operable to dissipate heat generated by the printed circuit board assembly away from the printed circuit board assembly. An insulating layer, such as a layer of dielectric, can be disposed between the signal carrying layer and at least one of the top and bottom surfaces of the PCB assembly, the insulating layer overlaying at least a portion of the signal carrying layer. A conductive via can be formed in the signal carrying layer, the conductive via operably coupling the first side of the first layer to a second side of the first layer, wherein the conductive via is formed in a portion of the signal carrying layer that is not occupied by the insert of PG.

In a further aspect, the invention comprises a method of dissipating heat generated in a printed circuit board (PCB). The method includes the unordered steps of providing an insert of pyrolytic graphite (PG) constructed and arranged to have its greatest conductivity in a first plane; disposing the insert within a first layer, the first layer comprising a layer of material that is electrically and thermally conductive, such that at least a portion of the insert is in thermal contact with at least a portion of the first layer; and using the first layer as a signal carrying layer in a printed circuit board (PCB).

The method can further comprise the unordered steps of operably coupling a heat-generating electrical component to at least one of the first and second layers; operably coupling a thermal dissipation member to the PCB, such that the heat dissipated by the first layer and the insert is directed towards the thermal dissipation member; and/or forming a conductive via in the first layer, the conductive via operably coupling a first side of the first layer to a second side of the first layer, wherein the conductive via is formed in a portion of the signal carrying layer that is not occupied by the insert.

Details relating to this and other embodiments of the invention are described more fully herein.

BRIEF DESCRIPTION OF THE DRAWINGS

The advantages and aspects of the present invention will be more fully understood in conjunction with the following detailed description and accompanying drawings, wherein:

FIG. 9 is a side cross sectional view of the power card baseplate of the DC/DC converter assembly of FIG. 1, showing a view taken along the line B-B of FIG. 8 and showing the first portion of FIG. 8 assembled to the second portion of FIG. 8;

FIG. 10 is a top perspective view of the power card baseplate of the DC/DC converter assembly of FIG. 1;

FIG. 11 is a bottom perspective view of the power card baseplate of the DC/DC converter assembly of FIG. 1;

FIG. 14 is a side cross-sectional view of a portion of the PWB panel of FIG. 13, taken along the B-B line;

FIG. 15 is an enlarged view of section A of FIG. 13;

FIG. 17 is a first temperature gradient graphical simulation of a prior art power DC/DC converter made using an aluminum baseplate;

FIG. 18 is a scale showing temperature gradients applicable to FIGS. 17 and 19;

FIG. 19 is a second temperature gradient graphical simulation of a DC/DC converter made using a baseplate made from annealed PG encapsulated in aluminum, in accordance with one embodiment of the invention.

In the drawings, like reference numbers indicate like elements. The drawings are not to scale, emphasis instead being on illustrating the principles of the invention.

DETAILED DESCRIPTION

Figure 1:
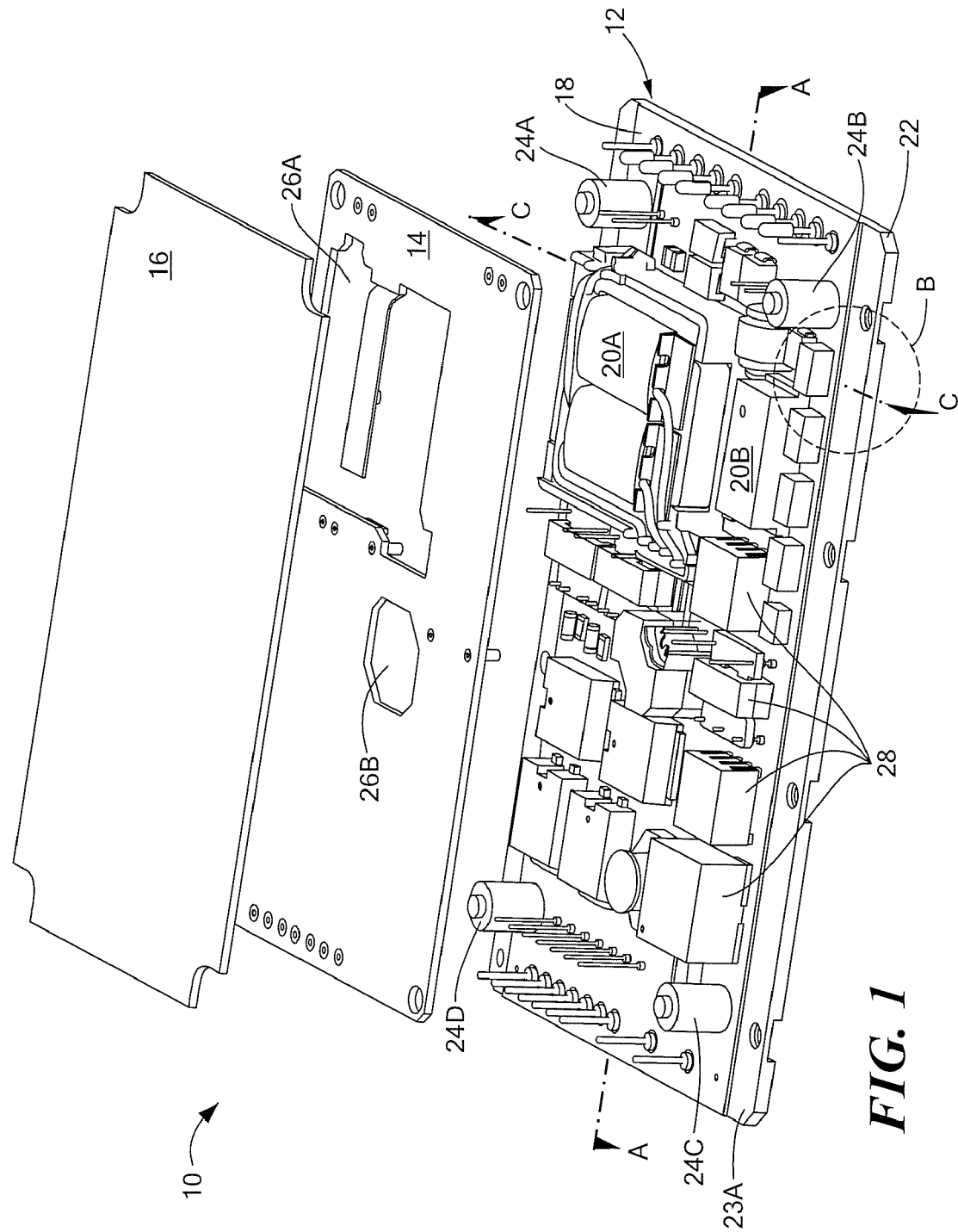
FIG. 1 is an exploded three-dimensional view of a DC/DC converter assembly in accordance with a first embodiment of the invention.

In addition to the various embodiment or embodiments disclosed below, this invention is capable of other embodiments and of being practiced or being carried out in various ways. For example, the invention is applicable to virtually any electrical device that generates heat, and is not limited to power devices or DC/DC converters. Various embodiments of the invention include (but are not limited too), DC/AC converters, AC/DC converters, AC/DC converters, power supplies, and the like. Thus, it is to be understood that the invention is not limited in its application to the details of construction and the arrangements of components set forth in the following description or illustrated in the drawings.

Figure 2:
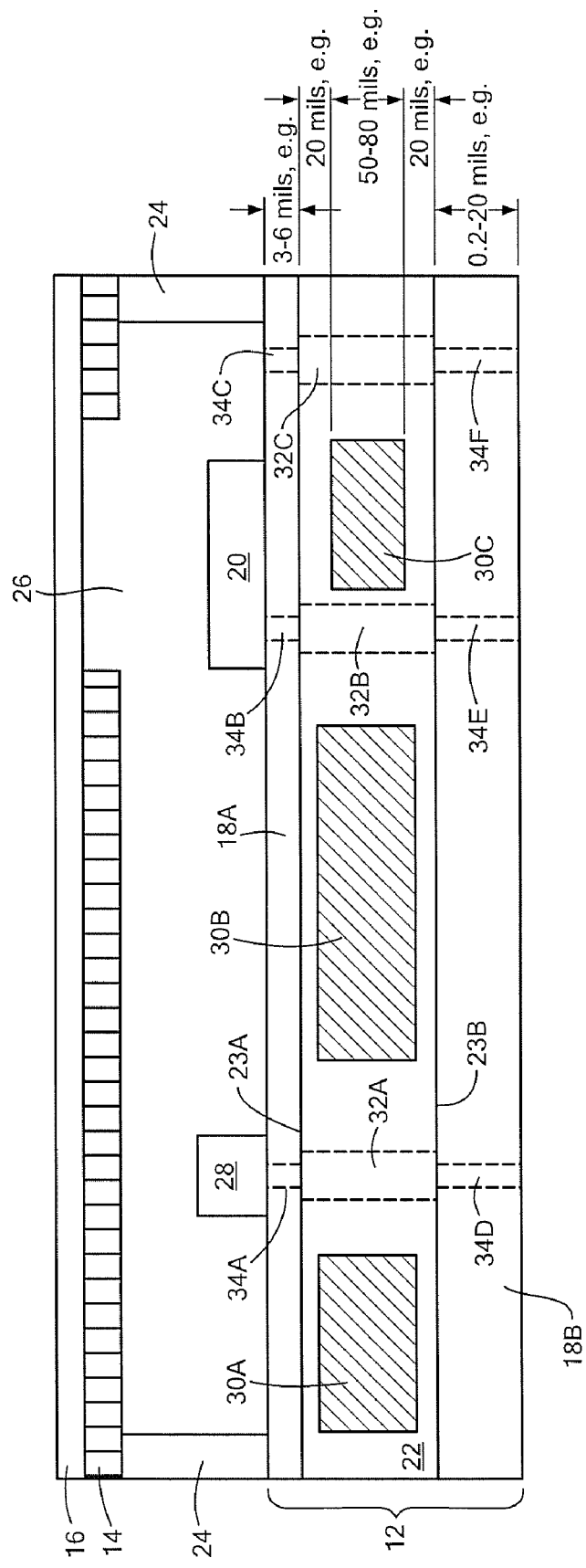
FIG. 2 is a cross-sectional side view of the DC/DC converter assembly of FIG. 1, in accordance with a second embodiment of the invention.

FIG. 1 is an exploded three-dimensional view of a DC/DC converter assembly 10 in accordance with a first embodiment of the invention. FIG. 2 is a cross-sectional side view of the DC/DC converter assembly of FIG. 1, taken along line A-A. Referring to FIGS. 1 and 2, the DC/DC converter assembly 10 includes a power card 12, a control circuit card assembly (CCA) 14 (which optionally can include an opening 26 positioned over a high heat flux electrical component 20), and a control CCA label 16. It is important to note that the control CCA 14 and CCA label 16 are shown for illustrative purposes only and are not necessary for all embodiments of the invention.

Figure 5:
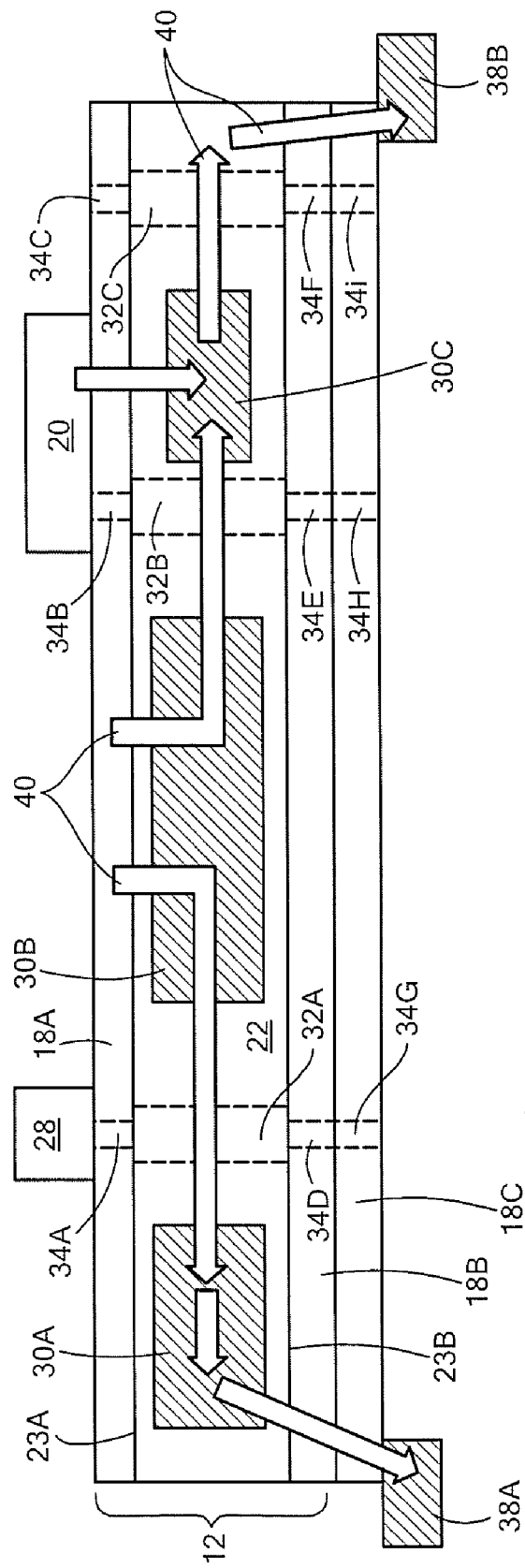
FIG. 5 is a cross-sectional side view of a DC/DC converter assembly in accordance with a second embodiment of the invention.
Figure 6:
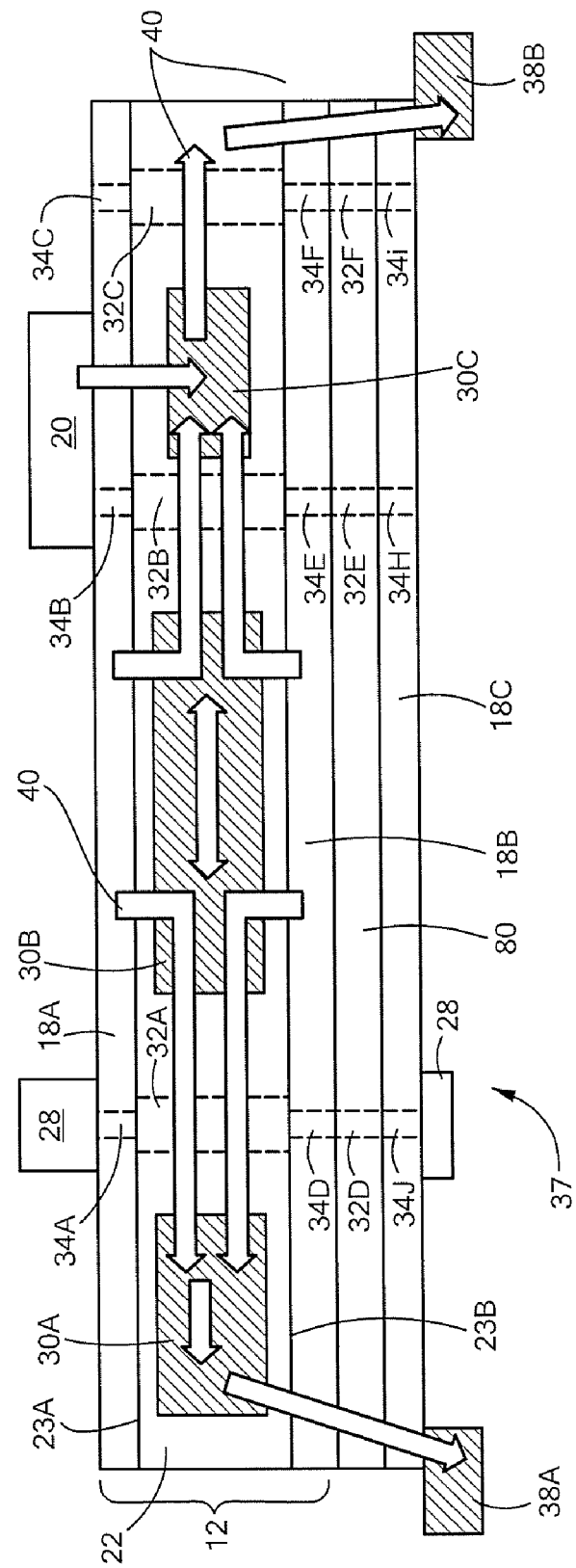
FIG. 6 is a cross-sectional side view of a DC/DC converter assembly in accordance with a third embodiment of the invention.
Figure 7:
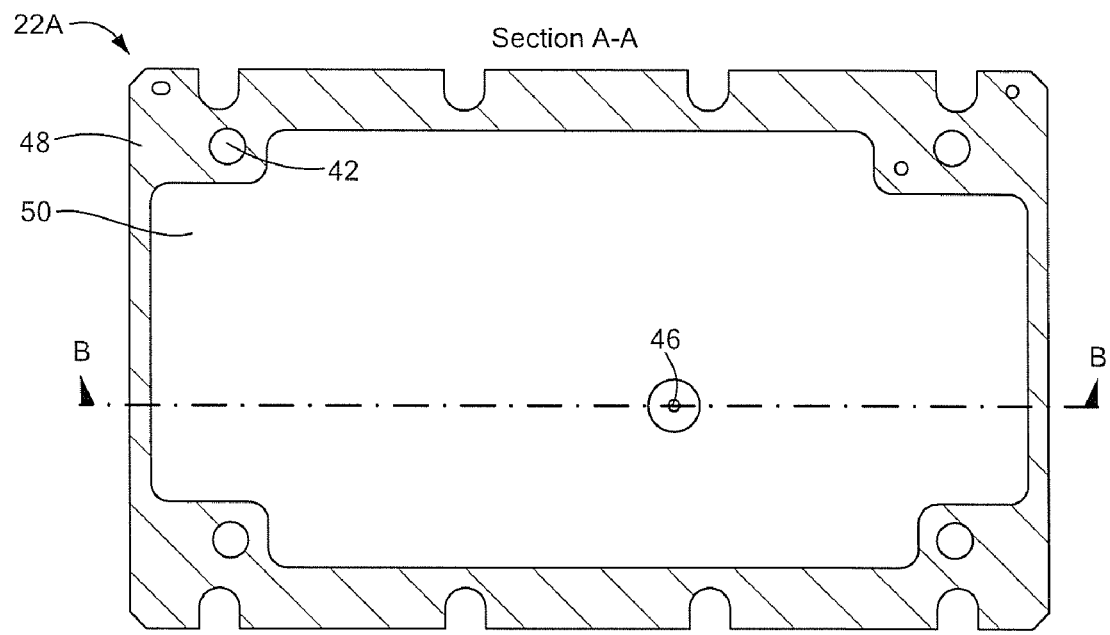
FIG. 7 is a top cross-sectional view of a first portion of the power card baseplate of the DC/DC converter assembly of FIG. 1, showing a view taken along the line A-A of FIG. 9.

The power card 12 is a so-called printed circuit card or printed wiring board (PWB) that includes at least a first layer of dielectric material 18A, a first power card baseplate 22 (which in this example serves as the current carrying layer) having a top surface 23A and a bottom surface 23B, and a second layer of dielectric material 18B (the dielectric layer 18B of FIG. 2 is also referred to as a substrate). As shown in FIGS. 1 and 2, the dielectric layers 18A, 18B and the power card baseplate 22 are substantially planar, but the invention is not so limited. In addition, the power card 12 may include some other layers (not shown in FIGS. 1 and 2); for example, FIG. 5 illustrates a power card 12 having a third dielectric layer 18C and FIG. 6 illustrates a power card 12 having a first power card baseplate 22 and a second power card baseplate 80 (which itself also carries electrical signals) and a third dielectric layer 18C. Such layers could, for example, include internal and external electrical interconnects, strip lines, waveguides, additional dielectric and/or conductive layers, and the like, as is well understood by those of skill in the art. In addition, depending on the application, the entire power card could be encapsulated with a protective coating (e.g., so-called "conformal coating", such as urethane, silicone, acrylic, parylene, etc.) (not shown in the drawings), as is known in the art.

The first and second layer of dielectric material 18A, 18B are made from a dielectric material able to withstand the current and power requirements of the DC/DC converter, as understood by those in the art. It is advantageous to use dielectrics with high dielectric withstanding voltages in applications that use high power and high heat dissipation, which enables the layer to be thinner while still providing appropriate levels of electrical protection. In the embodiment of FIGS. 1 and 2, for example, the first layer 18A of dielectric material 18 comprises, in one embodiment, a layer approximately 3-6 mils thick of a dielectric material having a polymer/ceramic blend, such as the Bergquist Multipurpose (MT) or Bergquist High Temperature (HT) dielectric material. Both the MT and HT dielectric materials are available from Bergquist Company of Chanhassen, Minn. The second layer 18B of dielectric material, which serves as a substrate to the power card 12, can be thicker or thinner (e.g., 0.2 to 20 mils) than the first layer, as required. The thickness of the dielectric layer is not limiting, nor is the particular dielectric material that is used limiting. Many other dielectric and printed wiring board materials are also usable for either or both dielectric layers 18A, 18B, including but not limited to RT/DUROID (available from Rogers Corporation of Chandler, Ariz.), TEFLON (available form DuPont Corporation of Wilmington, Del., combinations of glass and epoxy such as FR-4, polyimide, ceramic, fiberglass, and many other materials known to those of skill in the art.

Referring again to FIGS. 1 and 2, as well as to FIGS. 3-6, the first layer 18A of dielectric has electrical components (e.g., first and second high heat flux components 20A, 20B and other electrical components 28) coupled thereto, such as by solder, epoxy, adhesive, or other known means. In addition, electrical interconnects (not shown) can be formed on the first layer 18A to connect the one or more electrical components with each other or with other layers of the power card 12, as is known in the art. A plurality of dielectric layer conductive vias 34A, 34B, 34C, 34D, 34E, 34F (e.g., in FIGS. 1 and 2), and 34G, 34H, 34I (e.g., in FIG. 5), and power card layer conductive vias 32A, 32B, 32C (e.g., in FIGS. 1 and 2) and 32D, 32E, 32F (e.g., in FIG. 6), help to interconnect one or more of the layers of the power card 12. The conductive vias can, for example, be plated through-holes and can help to electrically couple the electrical components with the first power card baseplate 22. The first layer 18A of dielectric material also includes optional copper standoffs 24A-D. The first and second layers 18A, 18B of dielectric material are coupled to the metal surfaces of the first power card baseplate 22 (described further below) by standard techniques known to those of skill in the art.

The power card baseplate 22 (which, importantly, is also a current carrying layer capable of carrying electrical signals) is made from a material (e.g., metal) that is electrically conductive and that also has fairly good thermal conductivity, such as aluminum, copper, silver, alloys of aluminum, copper, or silver, and/or other electrically and thermally conductive material known in the art. For example, in one embodiment, the power card baseplate is made from aluminum alloyed with magnesium and silicon (i.e., Aluminum 6061) having a T6 temper (although other heat temper grades are usable, as well). The power card baseplate 22 carries electrical signals, such as those used by one or more of the high heat flux components 20A, 20B and/or other electrical components 28.

Disposed within the power card baseplate 22 are one or more inserts 30 of annealed pyrolytic graphite (PG) (e.g., inserts 30A, 30B, and 30C shown in FIG. 2). The inserts 30 can be positioned so as to be disposed under or near high heat flux components 20, if desired. In addition the PG inserts 30 are positioned so that there is space between them where there is no PG insert 30, where the space contains only power card baseplate 22 material; this enables power card conductive vias 32A, 32B, 32C or other plated through holes can be formed therein, to interconnect one or more layers of the power card 12 in a manner common in the art. In an illustrative embodiment, the annealed PG insert 30 has a conductivity of 1550-1750 Watts/meter-Kelvin (W/mK) (in the X-Y lateral plane) and 5.4-8.3 W/mK (through the thickness). Pyrolytic graphite meeting this requirement is available from various manufacturers, including B.F. Goodrich, Inc. of Santa Fe Springs, Calif. As those of skill in the art will appreciate, many other types of pyrolytic graphite are usable, as well. Using PG with lower conductivity will, of course, result in lower thermal performance and, thus, a higher temperature rise for a given power dissipation.

Making the power card baseplate 22 of a material that is thermally conductive and providing one or more PG inserts 30 in the power card baseplate 22, as is provided in the embodiments of the invention described herein, helps to transfer heat generated by electrical components, such as the high-heat flux electrical components 20A, 20B and/or the other electrical components, away from the components much more effectively than with a baseplate without PG inserts 30. At the same time, because the power card baseplate 22 also is electrically conductive, the power card baseplate 22 not only improves thermal performance, the power card baseplate 22 can perform two functions at once and save weight and cost in the power card 12, thereby improving performance in and saving weight and cost of the resultant DC/DC converter 10, as well.

Referring again to FIGS. 1 and 2, in one embodiment, the PG inserts 30 are substantially planar and each range in thickness from 50-80 mils (although this thickness is not limiting). The thickness of the power card baseplate 22 over and under the PG inserts 30 is, in the example of FIG. 2, about 20 mils in thickness. It is advantageous to have the power card baseplate 22 be as thin as possible in the areas disposed over and under the PG insert 30, to help maximize the thermal dissipation provided by the PG inserts 30 while still covering the PG insert 30. The thickness of the power card baseplate 22 over the PG insert 30 will, of course, be at least partially dependent on the thickness of the PG insert 30. It is most beneficial to have the power card baseplate 22 form a relatively thin "shell" or "skin" over the PG insert 30. In addition, it is advantageous if the power card baseplate 22 fits closely enough around the PG insert 30 so as to keep it in a fixed position and maintain direct physical contact with the PG insert 30 along at least one planar surface. In one embodiment, using the method described below in connection with FIGS. 7-11, the PG insert 30 maintains intimate contact with the power card baseplate 22 on all four of its sides. In one embodiment, the PG insert 30 can have virtually any shape and any number of sides, so long as at least a portion of the PG insert 30 is in thermal contact (e.g., intimate or direct contact, but can also be contact via another thermally conductive member or element, such as via a thermally conductive adhesive) with at least a portion of the power card baseplate 22. Advantageously, substantially all of the exterior surface of the PG insert 30 is in thermal contact with the power card baseplate 22.

Figure 8:
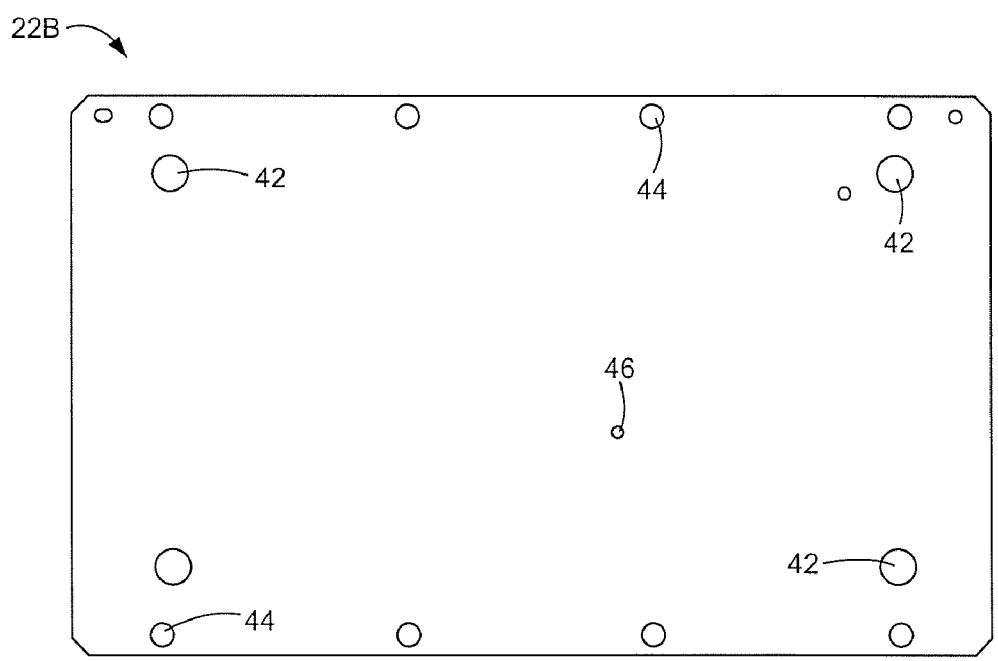
FIG. 8 is a top view of a second portion of the power card baseplate of the DC/DC converter assembly of FIG. 1.

There are various ways to form the power card baseplate 22 such that the PG inserts 30 are effectively embedded within it. In one embodiment of the invention, the aluminum of the power card baseplate 22 is formed into two halves, with one of the halves having an opening formed therein sized to fit the PG insert 30, and the two halves are fixedly coupled together. For example, referring briefly to FIGS. 7-11, FIG. 7 is a top cross-sectional view of a first portion 22A of the power card baseplate 22 (also referred to as the electrically conductive layer 22) of the DC/DC converter assembly 10 of FIG. 1, showing a view taken along the line A-A of FIG. 9, and FIG. 8 is a top view of a second portion 22B of the power card baseplate 22 of the DC/DC converter assembly 10 of FIG. 1. The first portion 22A of the power card baseplate 22 includes an opening 50 sized to fit a PG insert 30. The first portion 22A also includes an alignment hole 46.

After the PG insert 30 (not shown in FIGS. 7 and 8) is positioned in the opening 50, the first portion 22A and second portion 22B are positioned together so that the other holes (e.g., holes for standoffs 42, mounting holes for edge cooling 44, etc.) are in alignment. In one embodiment, the first portion 22A and second portion 22B are high-pressure diffusion bonded together, in a manner known in the art (e.g., as described in the aforementioned and incorporated by reference U.S. Pat. No. 6,903,931), around the perimeter of the first and second portions 22A, 22B, to form a power card baseplate 22. The power card baseplate 22 as fully assembled is further illustrated in FIG. 9, which is a side cross sectional view of the power card baseplate 22 of the DC/DC converter assembly of FIG. 1, showing a view taken along the line B-B of FIG. 7 and showing the first portion of FIG. 7 assembled to (e.g., diffusion bonded to) the second portion of FIG. 8. FIG. 10 is a top perspective view of the power card baseplate 22, and FIG. 11 is a bottom perspective view of the power card baseplate 22. It is advantageous if the first and second portions 22A, 22B of the power card baseplate 22 are fixedly coupled together to form an airtight, hermetic seal against moisture, oxidants, and other corrodants.

Other methods are usable to couple the first portion 22A and the second portion 22B of the power card baseplate 22 together, including Hot Isostatic Press (HIP), adhesive, spot welding, mechanical fasteners, and the like, so long as the method of coupling maintains the thermal and electrical conductivity between the first and second portions 22A, 22B of the power card baseplate.

Figure 12:
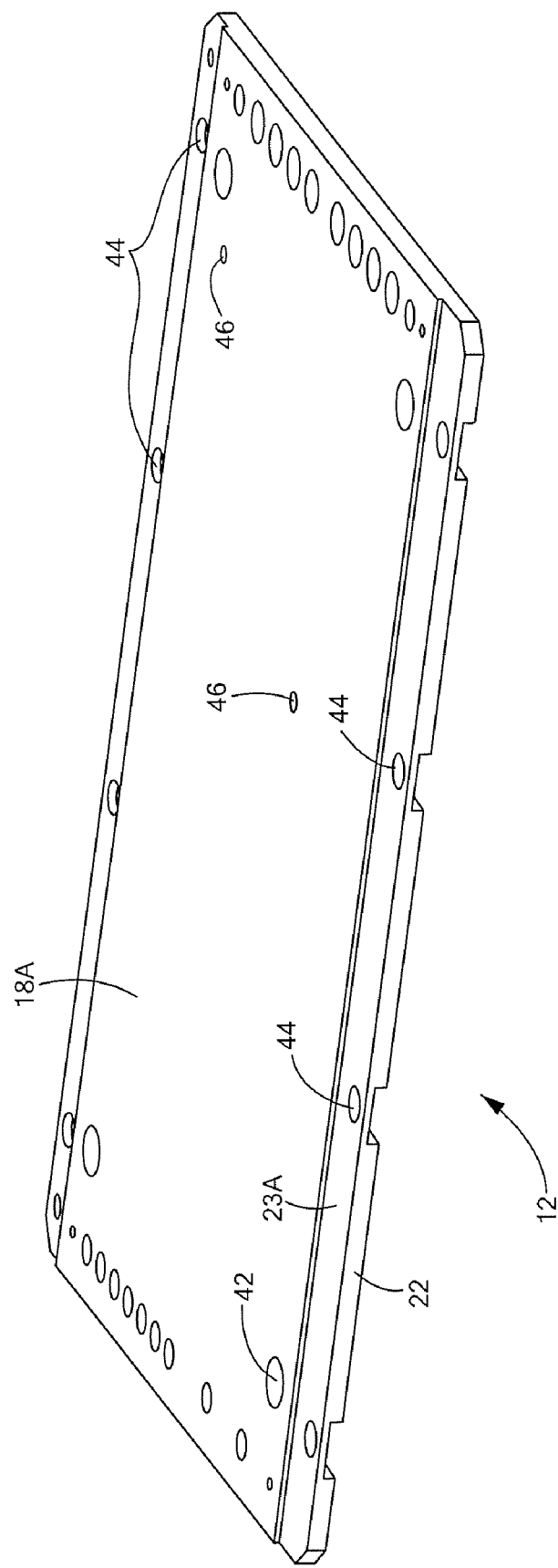
FIG. 12 is a perspective view of the power card of the DC/DC converter assembly of FIG. 1.

FIG. 12 is a perspective view of the power card 12 of the DC/DC converter assembly of FIG. 1, after the manufacturing of FIGS. 7-11 is completed and a top layer of dielectric 18A is applied to the top surface 23A of the power card baseplate 22. As FIG. 12 illustrates, the top layer 18A of dielectric does not have to cover the entire top surface 23A of the power card baseplate 22. In one embodiment, this is done so that the metalized edges of the top surface 23A (that is, the portions of the top surface 23A that are not covered by dielectric 18A) are left exposed to enable the mounting holes for edge cooling 44 to be available to be coupled to a next higher assembly, as explained further herein. It should be noted that the arrangement of edge cooling holes 44 shown in FIG. 12 is specific to the next higher assembly, and other configurations of holes, or even no holes, is possible in at least some embodiments of the invention. For example, in at least one embodiment of the invention, the dielectric layer 18A completely covers the power card baseplate 22. In another embodiment, the dielectric layer 18A covers nearly all of the power card baseplate 22, but selected portions are uncovered and operably coupled directly to a next higher assembly and/or a thermal dissipation member.

Figure 13:
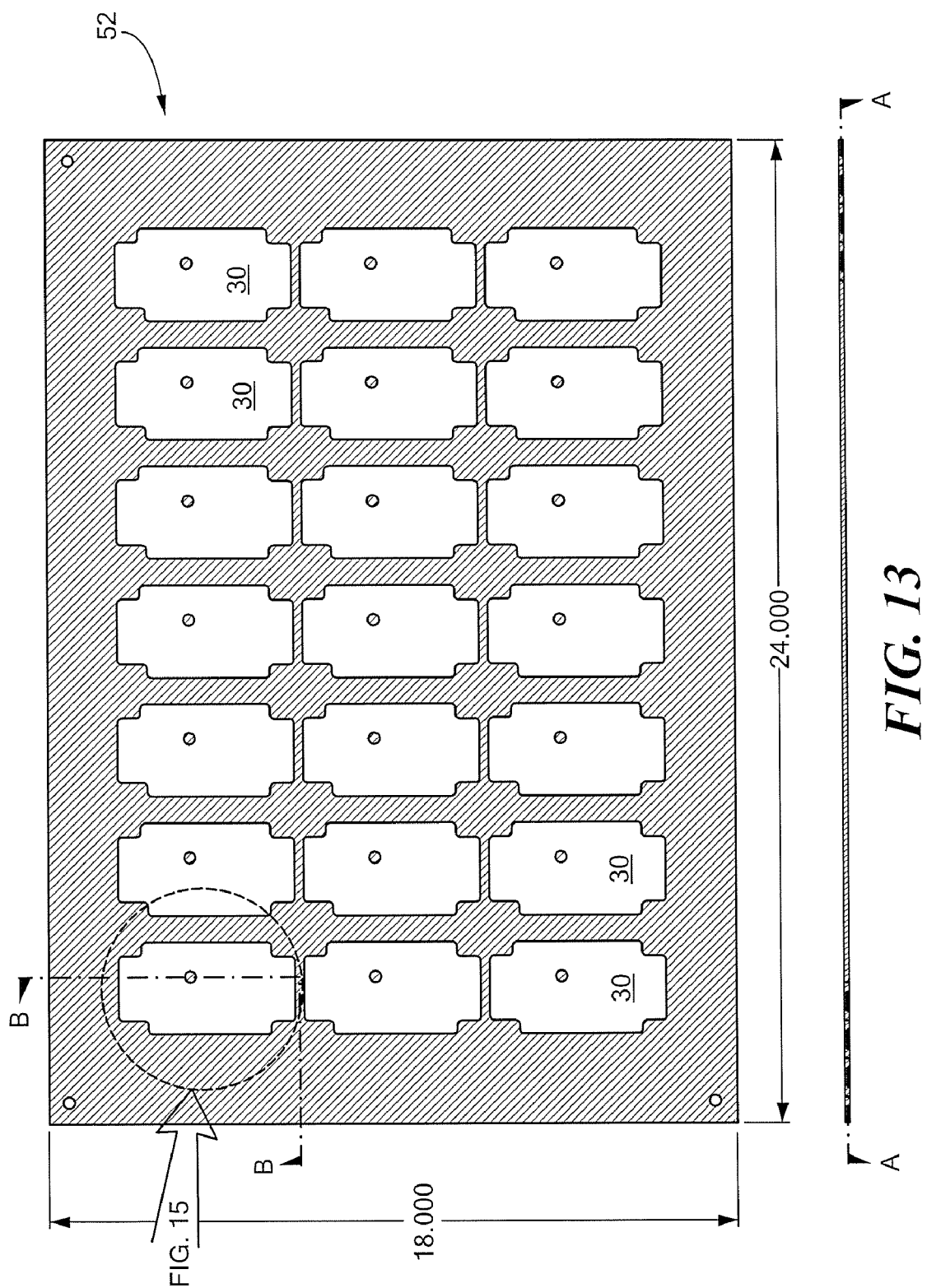
FIG. 13 is a top cross-sectional view of a panel drawing of a printed wiring board (PWB) manufactured in accordance with one embodiment of the invention, showing a plurality of pyrolytic graphite (PG) inserts.

Larger printed wiring board (PWB) panels containing numerous PG inserts 30 can also be manufactured in accordance with at least some embodiments of the invention. For example, FIG. 13 is a top cross-sectional view of a panel drawing of a printed wiring board (PWB) panel 52, manufactured in accordance with one embodiment of the invention, showing a plurality of pyrolytic graphite (PG) inserts. The PG inserts 30 can be embedded within the panel 52 in a manner similar to that described previously in connection with FIGS. 7-11. Note that the shape of the PG inserts 30 shown in FIG. 13; namely, a rectangular shape with corners removed, is not limiting. Virtually any shape of PG insert 30 is usable in the embodiments of the invention. The particular shape of PG insert 30 shown in FIG. 13 is a shape that in this embodiment is tailored to control the temperature distribution in the PG insert 30 and the power card baseplate 22. The PG insert 30 of FIG. 13 happens to have corners removed so that the PG insert 20 within the power card baseplate 22 will not overlay the holes 44 (see FIG. 7) in the power card baseplate 22 and power card 12 that are intended for mounting the copper standoffs 24 (FIGS. 1 and 2).

In addition, PG inserts 30 that are substantially planar work well in layers that are part of printed circuit boards and similar assemblies, which themselves tend to be substantially planar. However, those of skill in the art will recognize that the shape of the PG insert 30 may be slightly curved, or have some other shape that follows the shape of the power card baseplate 22, for example, without deviating from the invention. In addition, it is expected that if a given power card baseplate 22 or similar conductive layer is designed to have a nonplanar orientation, or an orientation in two different planes (e.g., having a right angle), the PG inserts 30 likewise would follow the shape of the power card baseplate 22. For example, a power card baseplate having an "L" shape, with portions at a right angle to each other, could have a first PG insert disposed within one leg of the "L", in a plane parallel to the surface of the leg of the "L," and a second PG insert disposed within the other leg of the "L", in a plane parallel to the surface of the other leg of the "L".

Many other configurations, are, of course, are possible within the spirit and scope of the invention. For example, consider a housing or outer shell that houses a circuit card assembly or cold plate having a layer with embedded PG. The housing or shell can have virtually any shape; for example, the housing could be a box-like structure, where its sides are at approximately 90° angles to each other (and therefore not in the same plane as each other). The housing is made of a thermally conductive material, where the thermally conductive material may or may not also be electrically conductive. Such a housing or shell itself also includes one or more inserts of embedded PG disposed within the walls of the housing or shell, to help improve thermal spreading and thermal dissipation for any or all assemblies contained within it, especially for assemblies that are thermally (e.g., physically) coupled to the housing.

FIG. 14 is a side cross-sectional view of a portion of the PWB panel of FIG. 13, taken along the B-B line, showing the PG insert 30. FIG. 15 is an enlarged view of section A of FIG. 13, showing the shape of the PG insert 30. In this example, there is sufficient spacing between the PG inserts in the PWB panel 52 to permit later drilling of through-holed, for formation of electrically conductive vias, if desired. One use for the PWB panel 52 is to manufacture multiple power card baseplates 22 at the same time. These baseplates can later be separated, if desired, and used in multiple different devices (e.g., multiple different DC/DC converters).

Making the power card baseplate 22 of a material that is thermally conductive while also providing one or more PG inserts 30 in the power card baseplate 22, as is provided in the embodiments of the invention described herein, helps to transfer heat generated by electrical components, such as the high-heat flux electrical components 20A, 20B and/or the other electrical components, away from the components much more effectively than with a baseplate without PG inserts 30. At the same time, because the power card baseplate 22 also is electrically conductive, the power card baseplate 22 not only improves thermal performance by also, the power card baseplate 22 can perform two functions at once and save weight and cost in the power card 12, thereby improving performance in and saving weight and cost of the resultant DC/DC converter 10, as well.

Figure 3:
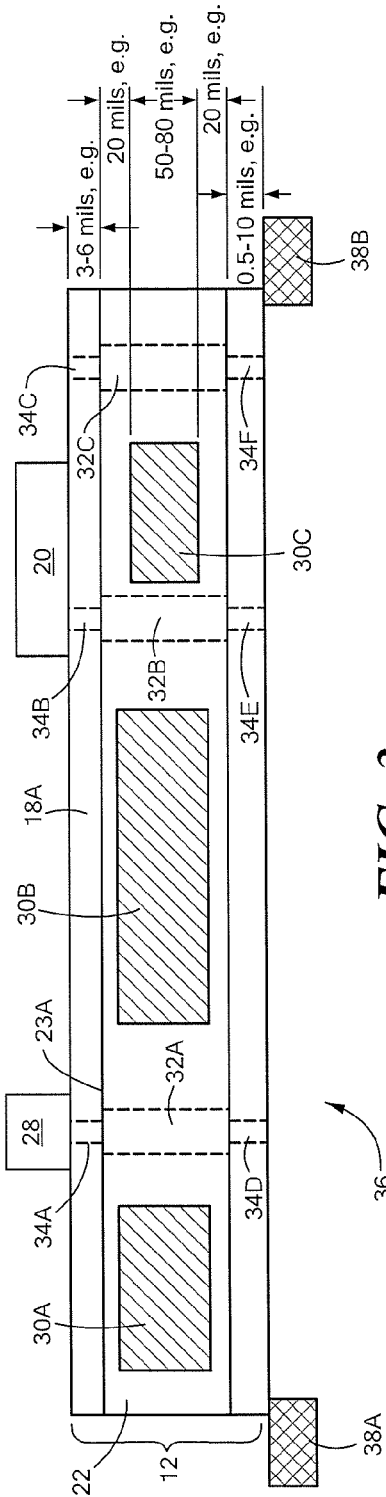
FIG. 3 is a cross-sectional side view of the power card portion of the DC/DC converter assembly of FIG. 1.
Figure 16:
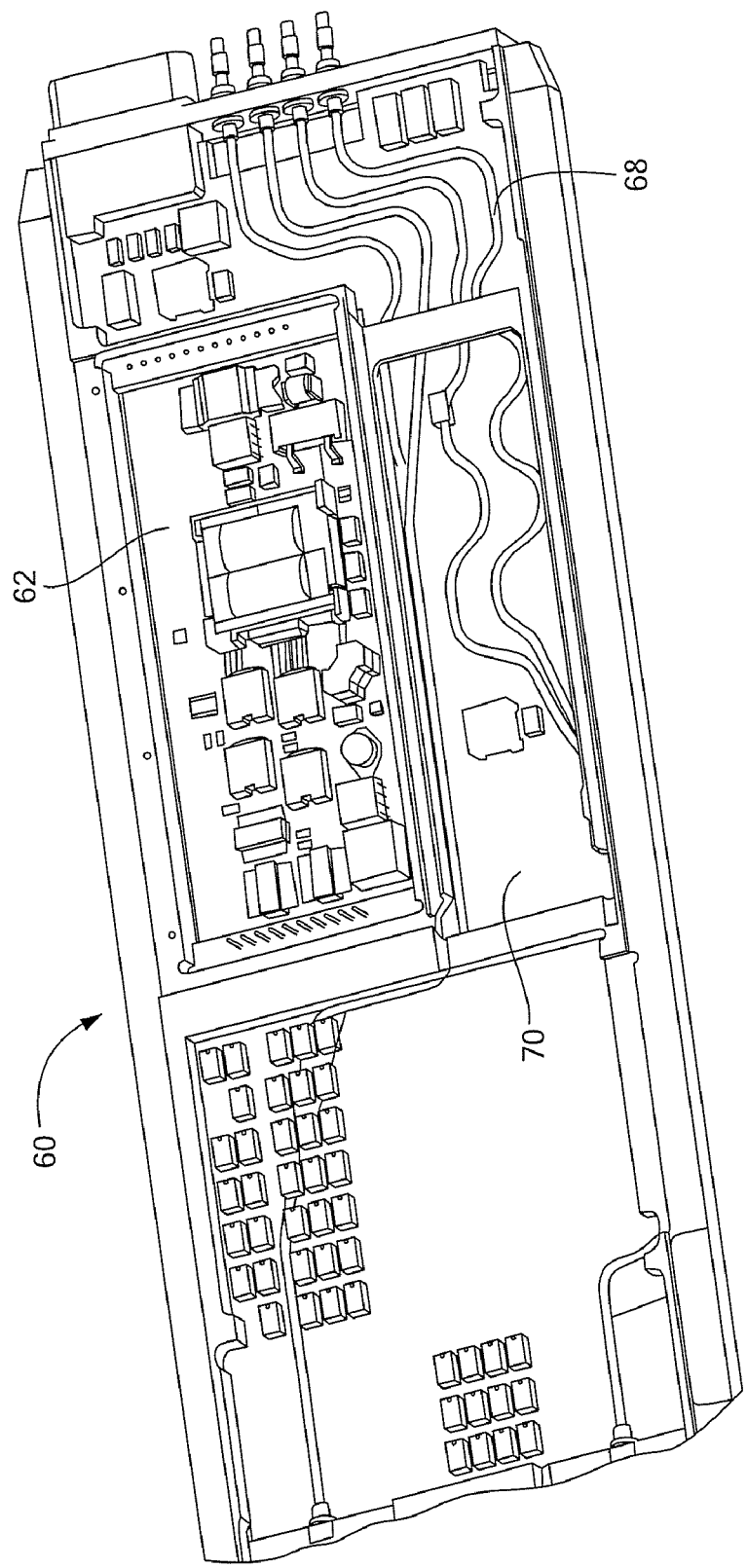
FIG. 16 is a top schematic view of a transmit/receive integrated multichannel module (T/RIMM) that employs two DC/DC converters implemented in accordance with one embodiment of the invention.

In one embodiment, the power card 12 further dissipates power to a next higher assembly (NHA), such as a cold plate in a device in which the power card 12 and/or DC/DC converter 10 is used. For example, FIG. 3 is a cross-sectional side view of the power card portion of the DC/DC converter assembly of FIG. 1, showing the power card coupled at either end to first and second portions, 38A, 38B of a cold plate, where the cold plate is part of a next higher assembly (e.g., a DC/DC converter installed into a transmit/receive module, such as the transmit/receive integrated multichannel module (T/RIMM) 60 of FIG. 16). Referring briefly to FIG. 16, the T/RIMM module 60 includes a DC/DC converter 62, one or more RF cables 68, and a Power Logic Circuit Card Assembly (PLCCA) 70. The cooling accomplished at this level of assembly is similar to that described in the aforementioned, commonly assigned, and incorporated by reference U.S. Pat. No. 6,903,931. In addition, it should be noted that the embodiments of the invention described herein are expressly anticipated as being usable with the subject matter described and claimed in the aforementioned U.S. Pat. No. 6,903,331.

Figure 4:
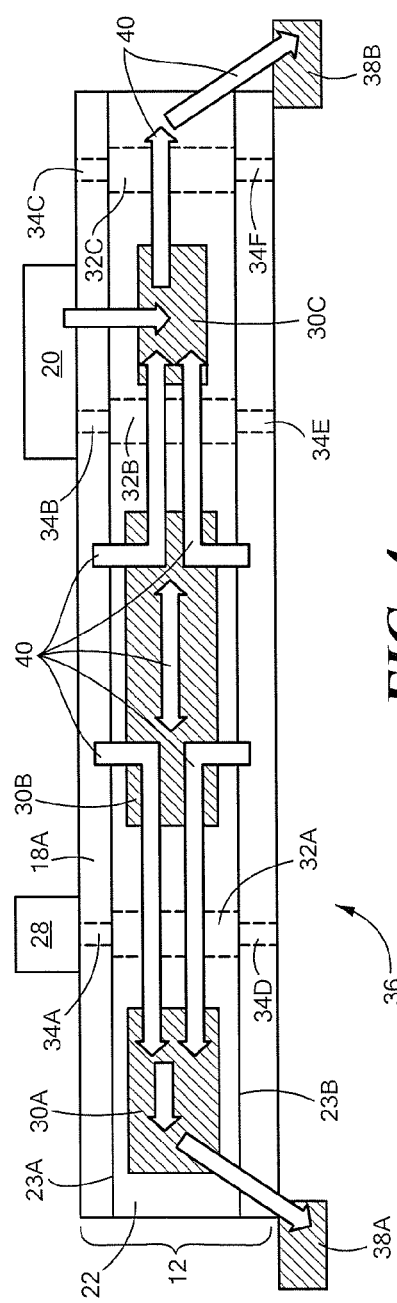
FIG. 4 is a cross-sectional side view of the power card portion of the DC/DC converter assembly of FIG. 1, with arrows showing the direction of heat flow.

Another view showing heat dissipation is FIG. 4, which is a cross-sectional side view of the power card portion of the DC/DC converter assembly of FIG. 1, with arrows 40 showing the direction of heat flow as flowing from the electrical components on the dielectric layer 18A, through the PG inserts 30 and the power card baseplate 22, and out of the edges of the power card 12 to the first and second portions 38A, 38B of the cold plate.

As noted previously, the power card 12 can have additional layers to those illustrated in FIGS. 1-3, and power can likewise be dissipated through those layers. For example, FIG. 5 is a cross-sectional side view of a DC/DC converter assembly in accordance with a second embodiment 36 of the invention. In the second embodiment 36, the power card 12 includes two layers 18B, 18C of dielectric coupled to the bottom surface 23B of the power card baseplate 22, with optional electrical vias 34A-34I running through the layers 18B, 18C of dielectric material. Embodiments that include two or more layers of dielectric material 18 generally will have more dielectric withstanding voltage than a single layer of dielectric material 18 and also enable carrying more electrical circuitry within the power card 12, as well as helping to ensure proper routing of electrical signals. Use of additional dielectric layers 18 achieves a similar function as known multi-layer circuit boards, but the dielectric layer 18 is used instead of a layer such as a layer of Flame-Retardent-4 (FR-4) material.

In another example, FIG. 6 is a cross-sectional side view of a DC/DC converter assembly in accordance with a third embodiment 37 of the invention. In the third embodiment 37, the power card 12 includes both another electrically conductive power card baseplate layer 80 and a third dielectric layer 18C, where the conductive layer optionally has conductive layer conductive vias 32D, 32E, 32F and the third dielectric layer 18C also has dielectric layer conductive vias 34G, 34H, 34I. Optionally one or more additional electrical components 28 can be mounted on third dielectric layer 18C and electrically coupled to the electrically conductive layer 80 and/or the power card baseplate 22.

As explained previously, testing and simulation of various embodiments of the invention has shown significant improvement over known power cards and power card baseplates. For example, FIG. 17 is a first temperature gradient graphical simulation of a prior art power DC/DC converter made using an aluminum baseplate without PG inserts. This graph shows near term power levels. The first area 90, corresponding to the location of a high heat flux component, is relatively dark, and per the scale of FIG. 18, indicates a maximum temperature reached is 139° C. FIG. 18 is a scale showing temperature gradients applicable to FIGS. 17 and 19. FIG. 19 is a second temperature gradient graphical simulation of a DC/DC converter, where this converter was made using a baseplate made from annealed PG encapsulated in aluminum, in accordance with one embodiment of the invention. It can be seen that the second area 92 is lighter in color, which corresponded to a maximum temperature reached of 109° C. Thus, using PG inserts, as described herein, help to reduce the temperature by 30° C.

Figure 20:
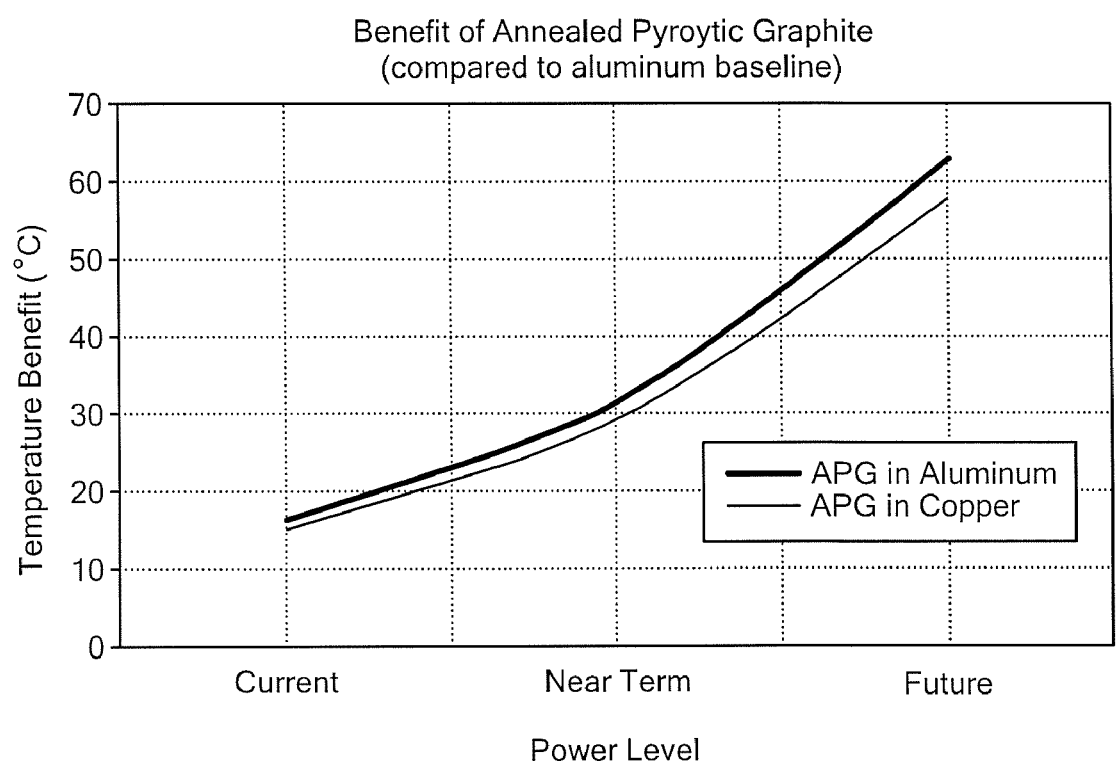
FIG. 20 is a graph illustrating the temperature benefits of annealed PG by power level.

FIG. 20 is a graph illustrating the temperature benefits of annealed PG by power level. The graph of FIG. 20 illustrates the significant improvement in thermal performance that use of inserts of annealed pyrolytic graphite (APG) provides over baseplates made of solid aluminum. The thicker line in the graph of FIG. 20 shows the improvement for inserts of annealed PG in copper, the thinner line in the graph of FIG. 20 shows the improvement for inserts of annealed PG in aluminum. As FIG. 20 illustrates, use of annealed PG inserts, as described for the embodiments of the invention herein, lowers the temperature of the components in the device (i.e., the "temperature benefit" of the graph of FIG. 20) by 15° Celsius (C.) at current power levels and lowers the temperature of the components over 60° C. for future power levels.

In describing the embodiments of the invention illustrated in the figures, specific terminology (e.g., language, phrases, product brands names, etc.) is used for the sake of clarity. These names are provided by way of example only and are not limiting. The invention is not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, modules, tables, software modules, objects, data structures, servers, etc. Such terminology used herein, however, is for the purpose of description and not limitation.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

In the Figures of this application, in some instances, a plurality of system elements or method steps may be shown as illustrative of a particular system element, and a single system element or method step may be shown as illustrative of a plurality of a particular systems elements or method steps. It should be understood that showing a plurality of a particular element or step is not intended to imply that a system or method implemented in accordance with the invention must comprise more than one of that element or step, nor is it intended by illustrating a single element or step that the invention is limited to embodiments having only a single one of that respective elements or steps. In addition, the total number of elements or steps shown for a particular system element or method is not intended to be limiting; those skilled in the art can recognize that the number of a particular system element or method steps can, in some instances, be selected to accommodate the particular user needs.

Having described and illustrated the principles of the technology with reference to specific implementations, it will be recognized that the technology can be implemented in many other, different, forms, and in many different environments. The technology disclosed herein can be used in combination with other technologies.

In addition, those of ordinary skill in the art will appreciate that the embodiments of the invention described herein can be modified to accommodate and/or comply with changes and improvements in the applicable technology and standards referred to herein. Variations, modifications, and other implementations of what is described herein can occur to those of ordinary skill in the art without departing from the spirit and the scope of the invention as claimed.

The particular combinations of elements and features in the above-detailed embodiments are exemplary only; the interchanging and substitution of these teachings with other teachings in this and the referenced patents/applications are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto.

Having described the preferred embodiments of the invention, it will now become apparent to one of ordinary skill in the art that other embodiments incorporating their concepts may be used. These embodiments should not be limited to the disclosed embodiments, but rather should be limited only by the spirit and scope of the appended claims.

The invention claimed is:

1. A circuit card assembly, comprising:
   a first layer having first and second sides, at least a portion of the first layer being substantially planar in a first x-y plane, wherein the first layer comprises a first material that is electrically and thermally conductive, such that the first layer is constructed and arranged to carry electrical signals;
   a first insert, the first insert comprising a solid, continuous piece of pyrolytic graphite (PG) disposed between the first side and the second side of the first layer, wherein the first insert is substantially planar in the x-y direction and is constructed and arranged to have its highest thermal conductivity in the x-y plane, and wherein the first insert has an exterior surface of solid, continuous PG that is surrounded on all sides by the first layer, such that substantially all of the exterior surface of the first insert is in continuous thermal contact with the first layer, the first insert being oriented within the first layer such that the insert can dissipate heat generated by the circuit card assembly; and
   a second layer having first and second sides, the second layer comprising at least one of an insulating and a dielectric material, wherein the second side of the second layer is coupled to the first side of the first layer so as to overlay at least a portion of the first layer.

2. The circuit card assembly of claim 1 wherein at least a portion of the second layer is electrically coupled to the first layer.

3. The circuit card assembly of claim 1 wherein at least one of the first and second layers is constructed and arranged to permit a heat-generating electrical component to be operably coupled thereto and wherein the circuit card assembly is constructed and arranged to dissipate the heat generated by the electrical component.

4. The circuit card assembly of claim 1, wherein the circuit card assembly has at least one thermally conductive edge, wherein the first layer is in thermal contact with the thermally conductive edge, and wherein the first insert is oriented within the first layer so as to dissipate heat towards the thermally conductive edge of the circuit card assembly.

5. The circuit card assembly of claim 4 wherein at least one of the first and second layers is constructed and arranged to permit a heat-generating electrical component to be operably coupled thereto and wherein the circuit card assembly is constructed and arranged to dissipate the heat generated by the electrical component through the first layer and the first insert, towards the thermally conducting edge of the circuit card assembly.

6. The circuit card assembly of claim 4, further comprising a thermal dissipation member in thermal contact with the thermally conductive edge, wherein the circuit card assembly is constructed and arranged to dissipate the heat generated by the electrical component from the thermally conductive edge of the circuit card assembly into the thermal dissipation member.

7. The circuit card assembly of claim 6, wherein the thermal dissipation member comprises at least one of a cold plate and heat sink.

8. The circuit card assembly of claim 1, wherein the first layer comprises at least one of aluminum, copper, and silver and alloys thereof.

9. The circuit card assembly of claim 1, wherein the circuit card assembly comprises at least a portion of a power card.

10. The circuit card assembly of claim 1, wherein the circuit card assembly comprises at least a portion of at least one of a DC/DC converter, power supply, DC/AC converter, AC/DC converter, and AC/AC converter.

11. The circuit card assembly of claim 1, wherein the first layer and the first insert each has a respective thickness, wherein the first insert has a thickness greater than or equal to half the thickness of the first layer.

12. The circuit card assembly of claim 11, wherein the first insert is disposed within the first layer such that the thickness of the first layer between the first insert and the first side of the first layer is less than the thickness of the first insert.

13. The circuit card assembly of claim 1, wherein the first layer comprises a first portion and a second portion fixedly coupled together around the first insert of pyrolytic graphite, the first portion having an opening formed therein that is sized to receive the first insert and a second portion constructed and arranged to mate to the first portion so as to hold the first insert of pyrolytic graphite in a substantially fixed position.

14. The circuit card assembly of claim 13, wherein the first insert has an exterior surface and wherein the first portion and the second portion are constructed and arranged such that, when mated, at least a portion of the surface of the insert of pyrolytic graphite is in thermal contact with the first layer.

15. The circuit card assembly of claim 14, wherein the first portion and the second portion are constructed and arranged such that, when mated, substantially all of the surface of the first insert is in thermal contact with the first layer.

16. The circuit card assembly of claim 1, further comprising a second solid insert of PG disposed between the first side and the second side of the first layer, the second solid insert of PG being physically separate from the first solid insert of PG, wherein the second insert is substantially planar in the x-y direction and is constructed and arranged to have its highest thermal conductivity in the x-y plane, and wherein the second insert has an exterior surface that is surrounded on all sides by the first layer, such that substantially all of the exterior surface of the second insert is in thermal contact with at least a portion of the first layer, wherein the second insert is oriented within the first layer such that the second insert can dissipate heat generated by the circuit card assembly.

17. The circuit card assembly of claim 16, wherein the second insert lies in substantially the same plane as the first insert.

18. The circuit card assembly of claim 1, further comprising:
a conductive via formed in the first layer, the conductive via operably coupling the first side of the first layer to the second side of the first layer, wherein the conductive via is formed in a portion of the first layer that is not occupied by the first insert.

19. A printed circuit board (PCB) assembly adapted for mounting at least one heat-generating electrical device and providing integrated heat dissipating capability to dissipate heat generated by the electrical device, the printed circuit board assembly comprising:
a printed circuit board (PCB) having a top surface and a bottom surface;
a signal carrying layer disposed between the top surface and the bottom surface, the signal carrying layer comprising a material that is both thermally conductive and electrically conductive and having at least a portion lying in a first plane; and
a first solid, continuous insert of pyrolytic graphite (PG) disposed within at least a portion of the first plane of the-signal carrying layer, wherein the first insert is substantially planar in a second plane parallel to the first plane and has an exterior surface that comprises solid, continuous PG, where substantially all of the exterior surface is the insert being in thermal contact with the signal carrying layer, the first insert of PG being constructed and arranged to have its greatest thermal conductivity in the second plane.

20. The PCB assembly of claim 19, wherein the PCB further comprises at least one edge and wherein the signal carrying layer is in thermal contact with the edge, wherein the edge is operable to dissipate heat generated by the printed circuit board assembly away from the printed circuit board assembly.

21. The PCB assembly of claim 19, wherein the signal carrying layer comprises at least one of aluminum, copper, and silver an alloys thereof.

22. The PCB assembly of claim 19, further comprising an insulating layer disposed between the signal carrying layer and at least one of the top and bottom surfaces of the PCB assembly, the insulating layer overlaying at least a portion of the signal carrying layer.

23. The PCB assembly of claim 22, wherein the insulating layer comprises a dielectric material.

24. The PCB assembly of claim 19, further comprising a first conductive via formed in the signal carrying layer, the first conductive via operably coupling a first side of the signal carrying layer to a second side of the signal carrying layer, wherein the first conductive via is formed in a portion of the signal carrying layer that is not occupied by the insert of PG; and
a second conductive via formed in the PCB, the second conductive via operably coupling the top surface of the PCB to the top surface of the signal carrying layer, wherein the second conductive via is in substantial alignment with the first conductive via such that the first side of the PCB is conductively coupled to the second side of the second layer.

25. A method of dissipating heat generated in a printed circuit board (PCB), the method comprising the unordered steps of:
providing a solid, continuous, substantially planar insert of pyrolytic graphite (PG) constructed and arranged to have its greatest thermal conductivity in a first plane, the insert having an exterior surface of solid, continuous PG;
disposing the insert within a first layer oriented in a second plane that is parallel to the first plane, the first layer comprising a layer of material that is electrically and thermally conductive such that the first layer is constructed and arranged to carry electrical signals, where the first insert is disposed such that substantially all of the exterior surface of the insert is in continuous thermal contact with the first layer; and
providing the first layer as a signal carrying layer in a printed circuit board (PCB).

26. The method of claim 25, wherein the first layer has first and second sides and further comprising the unordered step of overlaying a second layer over at least a portion of one of the first and second sides of the first layer.

27. The method of claim 26, further comprising the unordered step of operably coupling a heat-generating electrical component to at least one of the first and second layers.

28. The method of claim 25, further comprising the unordered step of operably coupling a thermal dissipation member to the PCB, such that the heat dissipated by the first layer and the insert is directed towards the thermal dissipation member.

29. The method of claim 25, wherein the first layer has first and second sides and further comprising the unordered step of forming a conductive via in the first layer, the conductive via operably coupling the first side of the first layer to the second side of the first layer, wherein the conductive via is formed in a portion of the signal carrying layer that is not occupied by the insert.

30. The method of claim 25, wherein disposing the first insert within the first layer further comprises the unordered steps of:
providing a first portion of the first layer having an opening formed therein that is sized to receive the insert;
disposing the insert within the opening; and
fixedly coupling a second portion of the first layer to the first layer, wherein the first portion and the second portion are constructed and arranged to mate together so as to hold the insert of pyrolytic graphite in a substantially fixed position.

* * * * *

UNITED STATES PATENT AND TRADEMARK OFFICE
CERTIFICATE OF CORRECTION

PATENT NO. : 7,742,307 B2
APPLICATION NO. : 12/015918
DATED : June 22, 2010
INVENTOR(S) : Ellsworth et al.

It is certified that error appears in the above-identified patent and that said Letters Patent is hereby corrected as shown below:

Col. 2, line 35, delete "implemented, a" and replace with -- implemented; a --

Col. 2, line 37, delete "comes" and replace with -- comes from the --.

Col. 4 line 23, delete "of first" and replace with -- of the first --.

Col. 5 line 46, delete "cross sectional" and replace with -- cross-sectional --.

Col. 6 line 25, delete "too)," and replace with -- to), --.

Col. 6 line 66, delete "layer" and replace with -- layers --.

Col. 7 line 22, delete "form" and replace with -- from --.

Col. 8 line 2, delete "through holes" and replace with -- through-holes -- .

Col. 8 line 54 delete "be contact" and replace with -- be in contact --.

Col. 9 line 20, delete "cross sectional" and replace with -- cross-sectional --.

Col. 10 line 53, delete "through-holed," and replace with -- through-holes, --.

Col. 11 line 2, delete "performance by also," and replace with -- performance, --.

Col. 11 line 26, delete "6,903,331." and replace with -- 6,903,931 --.

Col. 13 line 8, delete "systems elements" and replace with -- system element --.

Col. 13 line 20, delete "user" and replace with -- user's --.

Col. 15 line 45, delete "the-signal" and replace with -- the signal --.

Signed and Sealed this

Ninth Day of November, 2010

David J. Kappos
*Director of the United States Patent and Trademark Office*

Col. 15, line 49, delete "is the insert being in" and replace with -- is in --.

Col. 15 line 61, delete "an" and replace with -- and --.

Col. 16 line 53-54, delete "the first insert" and replace with -- the insert --.